United States Patent
Ozturk et al.

(10) Patent No.: US 9,779,102 B2
(45) Date of Patent: Oct. 3, 2017

(54) METHOD AND APPARATUS FOR PROVIDING COMPRESSED DATA STRUCTURE

(71) Applicant: NAVTEQ B.V., Veldhoven (NL)

(72) Inventors: Yusuf Ozturk, Veldhoven (NL); Jeffrey Norton, Veldhoven (NL)

(73) Assignee: HERE Global B.V., Veldhoven (NL)

(*) Notice: Subject to any disclaimer, the term of this patent is extended or adjusted under 35 U.S.C. 154(b) by 95 days.

(21) Appl. No.: 13/793,788

(22) Filed: Mar. 11, 2013

(65) Prior Publication Data
US 2014/0258249 A1 Sep. 11, 2014

(51) Int. Cl.
G06F 7/00 (2006.01)
G06F 17/00 (2006.01)
G06F 17/30 (2006.01)
H03M 7/30 (2006.01)

(52) U.S. Cl.
CPC .. G06F 17/30153 (2013.01); G06F 17/30067 (2013.01); H03M 7/30 (2013.01)

(58) Field of Classification Search
CPC ........ G06F 17/30067; G06F 17/30153; H03M 7/30
USPC ........................................................ 707/693
See application file for complete search history.

(56) References Cited

U.S. PATENT DOCUMENTS

| | | | | |
|---|---|---|---|---|
| 5,884,306 A * | 3/1999 | Bliss | ............... | G06F 3/0481 |
| 6,006,232 A * | 12/1999 | Lyons | ............... | G06F 17/30595 |
| 6,016,497 A * | 1/2000 | Suver | ............... | G06F 17/30595 |
| 6,215,903 B1 * | 4/2001 | Cook | ............... | G06T 9/005 |
| | | | | 382/232 |
| 7,461,077 B1 * | 12/2008 | Greenwood | ............... | G06F 3/0482 |
| 2003/0009595 A1 * | 1/2003 | Collins | ............... | 709/247 |
| 2003/0098992 A1 * | 5/2003 | Park | ............... | H04L 1/1671 |
| | | | | 358/1.15 |
| 2005/0228811 A1 * | 10/2005 | Perry | ............... | H03M 7/30 |
| 2007/0288160 A1 | 12/2007 | Ebert | | |
| 2008/0299954 A1 | 12/2008 | Wright et al. | | |
| 2009/0083267 A1 * | 3/2009 | Johnson | ............... | H03M 7/46 |
| 2009/0319549 A1 * | 12/2009 | Millett | ............... | G06F 17/30961 |

(Continued)

OTHER PUBLICATIONS

TNT Products, "New Features in 2008 TNT Products," 59th Release Aug. 2008, pp. 1-16.

(Continued)

*Primary Examiner* — Kris Mackes
*Assistant Examiner* — Lin Lin Htay
(74) *Attorney, Agent, or Firm* — Ditthavong & Steiner, P.C.

(57) ABSTRACT

An approach for providing a compressed data structure of data records sharing one or more common values is described. A data compression platform may process and/or facilitate a processing of a plurality of data records to determine one or more repeating values common across the plurality of data records. The data compression platform may also cause, at least in part, a storage of the one or more repeating values in at least one header record of a data structure. The data compression platform may further cause, at least in part, a storage of one or more non-repeating values of the plurality of data records in respective one or more point records of the data structure associated with the at least one header record.

16 Claims, 9 Drawing Sheets

(56) References Cited

U.S. PATENT DOCUMENTS

| | | | | |
|---|---|---|---|---|
| 2010/0278446 | A1* | 11/2010 | Ganesh | G06F 17/30315 382/243 |
| 2011/0218976 | A1* | 9/2011 | Amit | G06F 3/0608 707/693 |
| 2012/0290542 | A1* | 11/2012 | Trotta et al. | 707/687 |
| 2013/0176315 | A1* | 7/2013 | Winkle | G06T 11/20 345/440 |
| 2013/0238573 | A1* | 9/2013 | Le Pifre | 707/693 |
| 2014/0244602 | A1* | 8/2014 | Rastogi et al. | 707/693 |

OTHER PUBLICATIONS

S. Krishnan et al., "OpenTopography: A Services Oriented Architecture for Comunity Access to LIDAR Topography," Article No. 7, Jan. 2011; In proceeding of: Proceedings of the 2nd International Conference and Exhibition on Computing for Geospatial Research & Application, COM.Geo 2011, Washington, DC, USA, May 23-25, 2011.

* cited by examiner

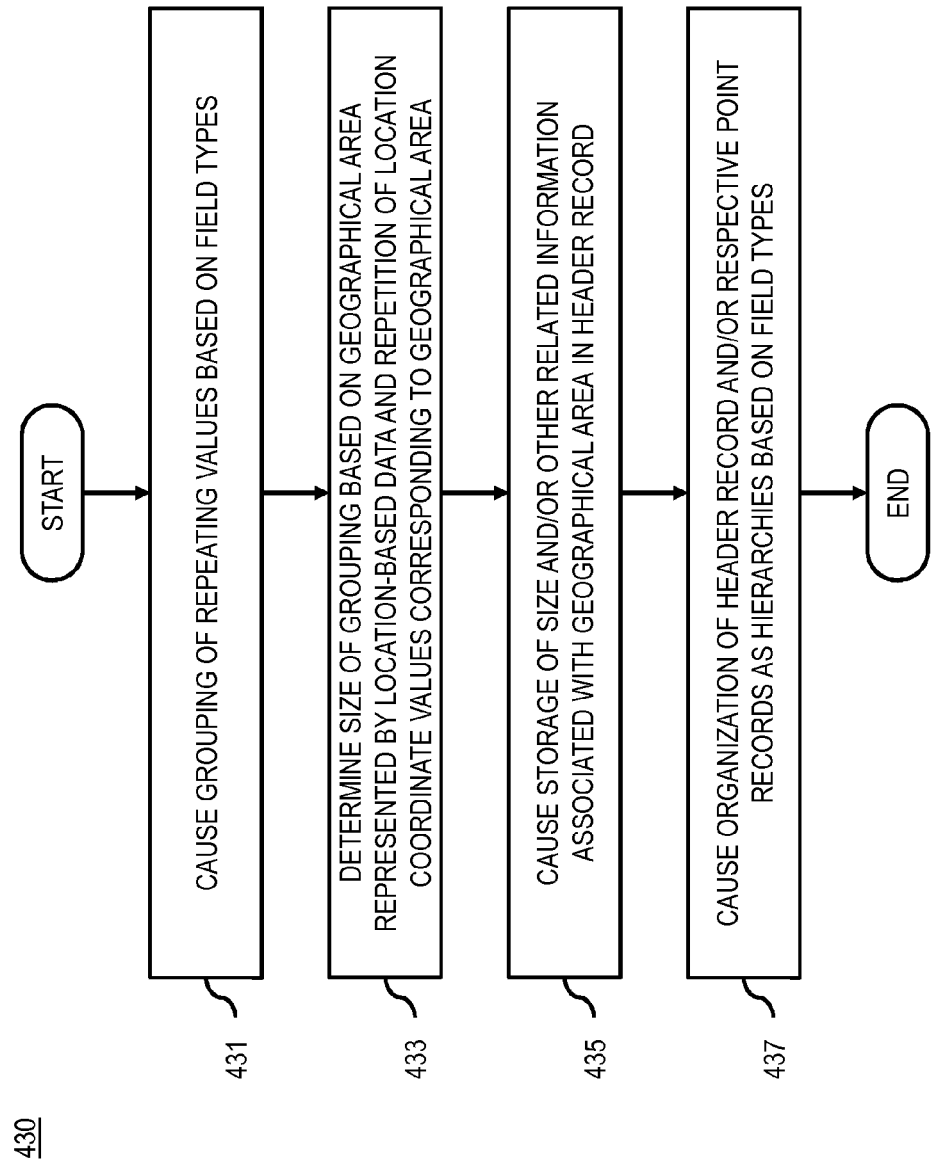

METHOD AND APPARATUS FOR PROVIDING COMPRESSED DATA STRUCTURE

BACKGROUND

Service providers and device manufacturers (e.g., wireless, cellular, etc.) are continually challenged to deliver value and convenience to consumers by, for example, providing compelling network services. Often times, the compelling network services process large amount of data, and thus, storage, transfer, and processing of the large amount of data require significant resources, such as network bandwidth, data storage, processor usage, etc. Among these resources, the network bandwidth and the data storage may be most affected by processing of the large amount of data. The processing power is likely the least affected due to its scalability and availability of cost effective high powered processors in servers and consumer devices alike. Accordingly, reducing the amount of data stored and transferred is critical for effective utilization of the resources (network bandwidth, data storage, etc.).

SOME EXAMPLE EMBODIMENTS

Therefore, there is a need for an approach for providing a compressed data structure of data records sharing one or more common values.

According to one embodiment, a method comprises processing and/or facilitating a processing of a plurality of data records to determine one or more repeating values common across the plurality of data records. The method also comprises causing, at least in part, a storage of the one or more repeating values in at least one header record of a data structure. The method further comprises causing, at least in part, a storage of one or more non-repeating values of the plurality of data records in respective one or more point records of the data structure associated with the at least one header record.

According to another embodiment, an apparatus comprises at least one processor, and at least one memory including computer program code for one or more computer programs, the at least one memory and the computer program code configured to, with the at least one processor, cause, at least in part, the apparatus to process and/or facilitate a processing of a plurality of data records to determine one or more repeating values common across the plurality of data records. The apparatus is also caused to cause, at least in part, a storage of the one or more repeating values in at least one header record of a data structure. The apparatus is further caused to cause, at least in part, a storage of one or more non-repeating values of the plurality of data records in respective one or more point records of the data structure associated with the at least one header record.

According to another embodiment, a computer-readable storage medium carries one or more sequences of one or more instructions which, when executed by one or more processors, cause, at least in part, an apparatus to process and/or facilitate a processing of a plurality of data records to determine one or more repeating values common across the plurality of data records. The apparatus is also caused to cause, at least in part, a storage of the one or more repeating values in at least one header record of a data structure. The apparatus is further caused to cause, at least in part, a storage of one or more non-repeating values of the plurality of data records in respective one or more point records of the data structure associated with the at least one header record.

According to another embodiment, an apparatus comprises means for processing and/or facilitating a processing of a plurality of data records to determine one or more repeating values common across the plurality of data records. The apparatus also comprises means for causing, at least in part, a storage of the one or more repeating values in at least one header record of a data structure. The apparatus further comprises means for causing, at least in part, a storage of one or more non-repeating values of the plurality of data records in respective one or more point records of the data structure associated with the at least one header record.

In addition, for various example embodiments of the invention, the following is applicable: a method comprising facilitating a processing of and/or processing (1) data and/or (2) information and/or (3) at least one signal, the (1) data and/or (2) information and/or (3) at least one signal based, at least in part, on (or derived at least in part from) any one or any combination of methods (or processes) disclosed in this application as relevant to any embodiment of the invention.

For various example embodiments of the invention, the following is also applicable: a method comprising facilitating access to at least one interface configured to allow access to at least one service, the at least one service configured to perform any one or any combination of network or service provider methods (or processes) disclosed in this application.

For various example embodiments of the invention, the following is also applicable: a method comprising facilitating creating and/or facilitating modifying (1) at least one device user interface element and/or (2) at least one device user interface functionality, the (1) at least one device user interface element and/or (2) at least one device user interface functionality based, at least in part, on data and/or information resulting from one or any combination of methods or processes disclosed in this application as relevant to any embodiment of the invention, and/or at least one signal resulting from one or any combination of methods (or processes) disclosed in this application as relevant to any embodiment of the invention.

For various example embodiments of the invention, the following is also applicable: a method comprising creating and/or modifying (1) at least one device user interface element and/or (2) at least one device user interface functionality, the (1) at least one device user interface element and/or (2) at least one device user interface functionality based at least in part on data and/or information resulting from one or any combination of methods (or processes) disclosed in this application as relevant to any embodiment of the invention, and/or at least one signal resulting from one or any combination of methods (or processes) disclosed in this application as relevant to any embodiment of the invention.

In various example embodiments, the methods (or processes) can be accomplished on the service provider side or on the mobile device side or in any shared way between service provider and mobile device with actions being performed on both sides.

For various example embodiments, the following is applicable: An apparatus comprising means for performing the method of any of originally filed claims 1-9, 19-27, and 42-44.

Still other aspects, features, and advantages of the invention are readily apparent from the following detailed description, simply by illustrating a number of particular embodiments and implementations, including the best mode contemplated for carrying out the invention. The invention is also capable of other and different embodiments, and its several details can be modified in various obvious respects, all without departing from the spirit and scope of the invention. Accordingly, the drawings and description are to be regarded as illustrative in nature, and not as restrictive.

BRIEF DESCRIPTION OF THE DRAWINGS

The embodiments of the invention are illustrated by way of example, and not by way of limitation, in the figures of the accompanying drawings:

FIG. 4B is a flowchart of a process for grouping and organizing header records of a data structure, according to one embodiment;

DESCRIPTION OF SOME EMBODIMENTS

Examples of a method, apparatus, and computer program for providing a compressed data structure of data records sharing one or more common values are disclosed. In the following description, for the purposes of explanation, numerous specific details are set forth in order to provide a thorough understanding of the embodiments of the invention. It is apparent, however, to one skilled in the art that the embodiments of the invention may be practiced without these specific details or with an equivalent arrangement. In other instances, well-known structures and devices are shown in block diagram form in order to avoid unnecessarily obscuring the embodiments of the invention.

As used herein, the term Light Detection and Ranging (LiDAR) may refer to optical remote sensing technology that can measure the distance to, or other properties of, targets by illuminating the target with laser light and analyzing the backscattered light. LiDAR technology may be applied in various areas such as geomatics, archaeology, geography, geology, geomorphology, seismology, forestry, remote sensing, atmospheric physics, airborne laser swatch mapping (ALSM), laser altimetry and contour mapping, etc.

As used herein, the term Inertial Measurement Unit (IMU) may refer to an electric device that measures and reports on a craft's velocity, orientation, and gravitational forces, using a combination of accelerometers and gyroscopes, sometimes also magnetometers. IMUs may be used to maneuver aircraft, including unmanned aerial vehicles (UAVs), and spacecraft, including satellites and landers. The IMU may be the main component of inertial navigation used in aircraft, spacecraft, watercraft, and guided missiles among others.

Figure 1:
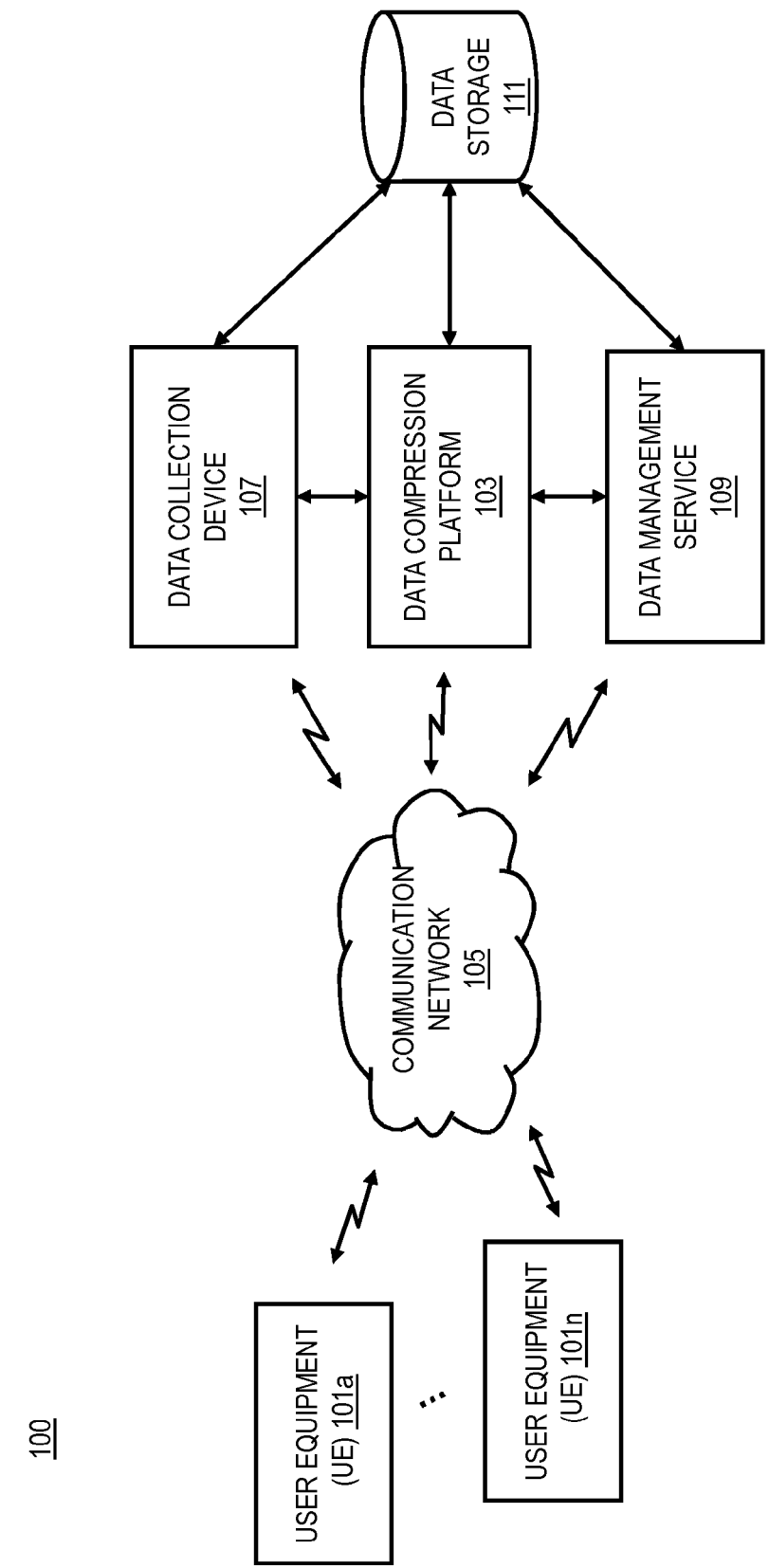
FIG. 1 is a diagram of a system capable of providing a compressed data structure of data records sharing one or more common values, according to one embodiment.

FIG. 1 is a diagram of a system capable of providing a compressed data structure of data records sharing one or more common values, according to one embodiment. Often times, the compelling network services (e.g., location based services) utilize large amount of data, and thus, storage, transfer, and processing of the large amount of data (e.g. location data), require significant resources, such as network bandwidth (e.g., amount data that can pass through the network), data storage (e.g., disk space, memory, cache, etc.), processing power. Among these resources, the network bandwidth and the data storage may be most affected by processing of the large amount of data. The processing power is likely the least affected due to its scalability and availability of cost effective high powered processors in servers and consumer devices alike. Accordingly, reducing the amount of data stored and transferred is critical for effective utilization of the resources (network bandwidth, data storage, etc.).

This challenge becomes even more importance for location-based services. For example, the location-based services, which often process Light Detection and Ranging (LiDAR) data, can collect about 285 GB of LiDAR data per day through a location data collection vehicle. Meantime, location data processing mostly occurs within a small area. Here are some examples: LiDAR and imagery data processing identify features usually at a street block or intersection level (e.g., area within 1 $km^2$); Map editing is performed mostly over small administrative areas such as postal code boundaries or street blocks (e.g., area within 25 $km^2$); A location data collection vehicle is driven to collect Inertial Measurement Unit (IMU) data mostly contained within a small area (e.g., area within 10 $km^2$); A map display on a user device that requires road geometry and possibly LiDAR detail usually cover a couple of street blocks (e.g., area within 1 $km^2$). The common ground in these examples is that they likely share same longitude, latitude, and altitude value. For example, every LiDAR data collected in downtown Chicago would contain latitude 41 degrees, a longitude of 87 degrees, and an altitude between 0 and 200 meters. Thus, the same values of the latitude, the longitude, and the altitude would be repeatedly stored and/or transferred over the network.

To address this problem, a system 100 of FIG. 1 introduces the capability to provide a compressed data structure of data records sharing one or more common values. In one embodiment, compressed data structure may store common value of data records in a header record of the compressed data structure. Non-repeating values of the data records may be stored in point records of the compressed data structure associated with the header records. Moving the common value of the data records to the header record can significantly reduce the size of the data records, and, in turn, can reduce usage of the network bandwidth for transmitting the data records and the data storage required for storing the data records. By way of example, the compressed data structure may store repeated values of latitude, longitude, and/or altitude of the location data in header record of compressed data structure. Non-repeated point specific values of the location data may be stored in point records of the compressed data structure. For example, in case of LiDAR data, about 98% of the LiDAR may represent point specific values. Further, the size of the coverage area associated with the location data may be related to how much of repeated latitude, longitude, altitude can be stored in the header record. For example, compression of the data records may become more efficient as coverage area gets smaller because more repeated values are stored in the header records. Thus, the smaller the coverage area, the more storage and bandwidth savings may be achieved.

As shown in FIG. 1, the system 100 comprises a data compression platform 103 having connectivity to a user equipment (UE) 101, a data collection device 107, a data management service 109, and a data storage 111 via a communication network 105. By way of example, the communication network 105 of system 100 includes one or more networks such as a data network, a wireless network, a telephony network, or any combination thereof. It is contemplated that the data network may be any local area network (LAN), metropolitan area network (MAN), wide area network (WAN), a public data network (e.g., the Internet), short range wireless network, or any other suitable packet-switched network, such as a commercially owned, proprietary packet-switched network, e.g., a proprietary cable or fiber-optic network, and the like, or any combination thereof. In addition, the wireless network may be, for example, a cellular network and may employ various technologies including enhanced data rates for global evolution (EDGE), general packet radio service (GPRS), global system for mobile communications (GSM), Internet protocol multimedia subsystem (IMS), universal mobile telecommunications system (UMTS), etc., as well as any other suitable wireless medium, e.g., worldwide interoperability for microwave access (WiMAX), Long Term Evolution (LTE) networks, code division multiple access (CDMA), wideband code division multiple access (WCDMA), wireless fidelity (WiFi), wireless LAN (WLAN), Bluetooth®, Internet Protocol (IP) data casting, satellite, mobile ad-hoc network (MANET), and the like, or any combination thereof.

The UE 101 is any type of mobile terminal, fixed terminal, or portable terminal including a mobile handset, station, unit, device, multimedia computer, multimedia tablet, Internet node, communicator, desktop computer, laptop computer, notebook computer, netbook computer, tablet computer, personal communication system (PCS) device, personal navigation device, personal digital assistants (PDAs), audio/video player, digital camera/camcorder, positioning device, television receiver, radio broadcast receiver, electronic book device, game device, or any combination thereof, including the accessories and peripherals of these devices, or any combination thereof. It is also contemplated that the UE 101 can support any type of interface to the user (such as "wearable" circuitry, etc.).

In one embodiment, the data collection device 107 may include, or be embedded in, any type of mobile terminal, fixed terminal, or portable terminal including a mobile handset, station, unit, device, multimedia computer, multimedia tablet, Internet node, communicator, desktop computer, laptop computer, notebook computer, netbook computer, tablet computer, personal communication system (PCS) device, personal navigation device, personal digital assistants (PDAs), audio/video player, digital camera/camcorder, positioning device, electronic book device, game device, or any combination thereof. In one embodiment, the data collection device 107 may be embedded in a vehicle. The vehicle may include a bicycle, a car, a motorcycle, a train, a ship, a boat, and an aircraft, a spaceship, etc.

In one embodiment, the data collection device 107 may be associated with sensors that detect various types of data. For example, the sensors may include speed sensors (e.g., accelerometer, speedometers, radar sensors, etc.), environment sensors (e.g., thermometers, humidity sensors, moisture sensors, barometers, etc.), navigation sensors (e.g., altitude sensors, gyroscopic sensors, compass sensors, inclination sensors, position sensors, distance sensors, etc.), optical/light sensors, angle sensors, motion sensors, proximity sensors, etc. In one embodiment, the data collection device 107 may collect data associated with locations (e.g., IMU data, LiDAR data, etc.). The data may be collected through the sensors and stored in the data storage 111.

In one embodiment, the data compression platform 103 may receive data (e.g. location data) collected by the data collection device 107 and compress the received data by performing steps described below in regard to FIGS. 4A-4C. The compressed data may be stored in the data storage 111. The data compression platform 103 may communicate with, or transmit the compressed data to, the UE 101, the data collection device 107, the data management service 109, and the data storage 111 via the communication network 105. Components of the data compression platform 103 are described below with respect to FIG. 3.

In one embodiment, the data management service 109 may include a service that process, organize, and/or distribute data based on policies and procedures for managing the data. For example, the data management service 109 may receive the compressed data from the data storage 111 and upon request from the UE 101, may transmit the compressed data to the UE 101 based on the policies and procedures of the data management service 109.

In one embodiment, the data storage 111 may be one or more data storages (e.g., disk drive, memory, database, etc.) and may be included in the data collection device 107, the data compression platform 103, and/or the data management service 109.

By way of example, the UE 101, the data compression platform 103, the data collection device 107, and the data management service 109 communicate with each other and other components of the communication network 105 using well known, new or still developing protocols. In this context, a protocol includes a set of rules defining how the network nodes within the communication network 105 interact with each other based on information sent over the communication links. The protocols are effective at different layers of operation within each node, from generating and receiving physical signals of various types, to selecting a link for transferring those signals, to the format of information indicated by those signals, to identifying which software application executing on a computer system sends or receives the information. The conceptually different layers of protocols for exchanging information over a network are described in the Open Systems Interconnection (OSI) Reference Model.

Communications between the network nodes are typically effected by exchanging discrete packets of data. Each packet typically comprises (1) header information associated with a particular protocol, and (2) payload information that follows the header information and contains information that may be processed independently of that particular protocol. In some protocols, the packet includes (3) trailer information following the payload and indicating the end of the payload information. The header includes information such as the source of the packet, its destination, the length of the payload, and other properties used by the protocol. Often, the data in the payload for the particular protocol includes a header and payload for a different protocol associated with a different, higher layer of the OSI Reference Model. The header for a particular protocol typically indicates a type for the next protocol contained in its payload. The higher layer protocol is said to be encapsulated in the lower layer protocol. The headers included in a packet traversing multiple heterogeneous networks, such as the Internet, typically include a physical (layer 1) header, a data-link (layer 2) header, an internetwork (layer 3) header and a transport (layer 4) header, and various application (layer 5, layer 6 and layer 7) headers as defined by the OSI Reference Model.

Figure 2:
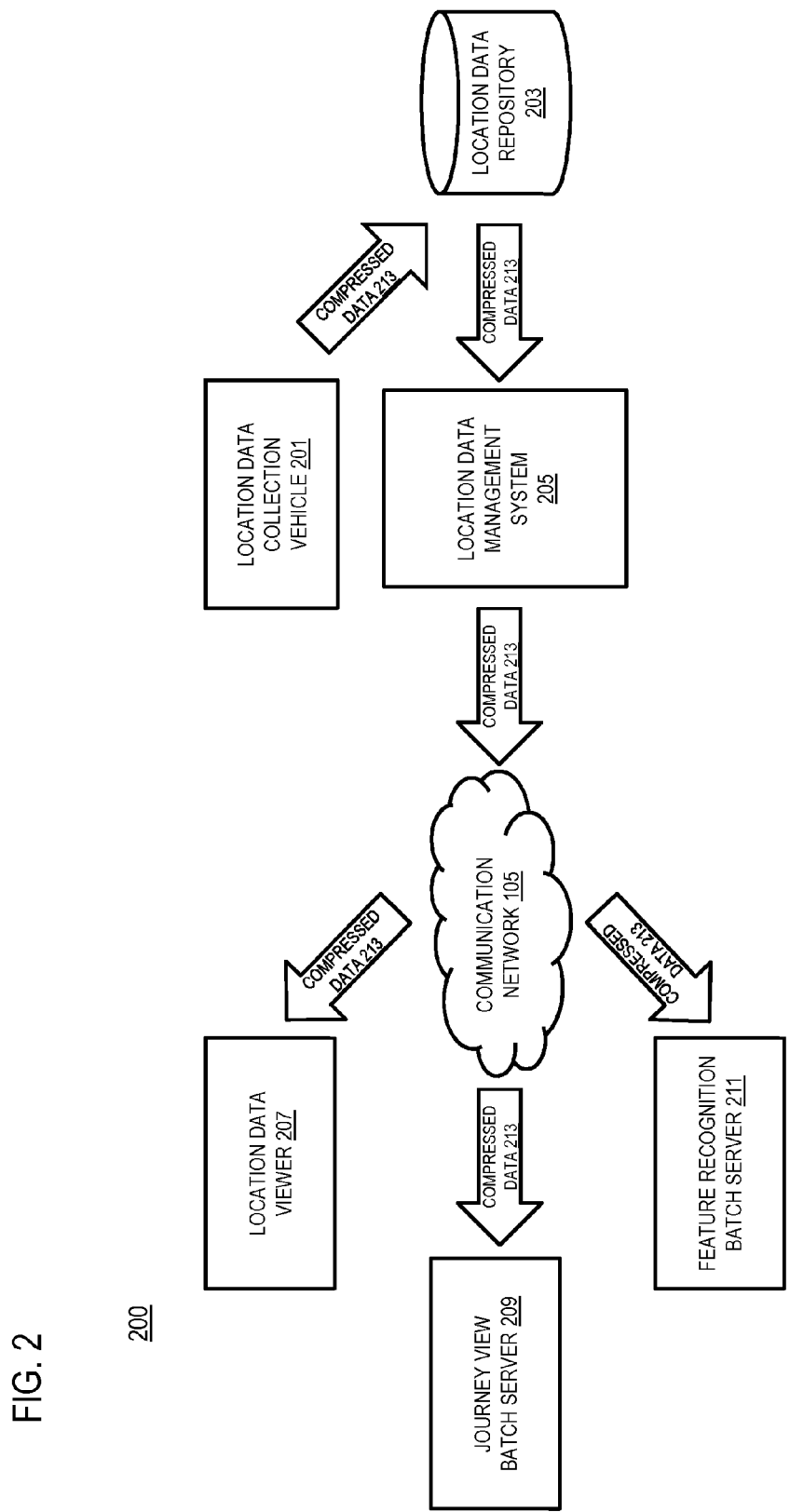
FIG. 2 is a diagram of a system capable of providing a compressed data structure of data records sharing one or more common values, according to another embodiment.

FIG. 2 is a diagram of a system capable of providing a compressed data structure of data records sharing one or more common values, according to another embodiment. A system 200 of FIG. 2 introduces the capability to provide a compressed data structure of location data sharing one or more common values. As shown in FIG. 2, the system 200 comprises a location data collection vehicle 201, a location data repository 203, a location data management system 205, a location data viewer 207, a journey view batch server 209, a feature recognition batch server 211, and compressed data 213. The compressed data 213 may be transferred from one component to another component of the system 200 via the communication network 105.

In one embodiment, the location data collection vehicle 201 may collect location data (e.g., IMU data, LiDAR data, etc.). The collected location data may be converted into the compressed data 213 and may be stored in a local storage (e.g., disk drive, memory, cache, etc.). The compressed data 213 may be stored or transferred into the location data repository 203. The location data management system 205 may receive the compressed data 213 from the location data repository 203 and transfer the compressed data 213 to clients over the communication network 105. The clients may include the location data viewer 207, the journey view batch server 209, the feature recognition batch server 211, etc. The clients may convert the compressed data 213 into the original location data before they process the data. The time required to compress or decompress the data can be much less than the time required to store or transmit the uncompressed data. Thus, the compressed data 213 may optimize the amount of data stored in a storage and transferred over the network.

In one embodiment, the location data collection vehicle 201 may include the data collection device 107, the data compression platform 103, the data management service 109, and/or the data storage 111. The location data repository 203, which may include the data storage 111, may be included in the location data collection vehicle 201 or the location data management system 205. The location data management system 205 may include the data compression platform 103 and/or the data management service 109. The location data viewer 207, the journey view batch server 209, and/or the feature recognition batch server 211 may include the UE 101. In one embodiment, the collected location data may be converted within the location data repository 203 or the location data management system 205, instead of the location data collection vehicle 201.

In one embodiment, the location data viewer 207 may enable presentation of the location data. For example, the location data viewer 207 may present the location data via a user interface or an application (e.g., browser, software, etc.). In one embodiment, the journey view batch server 209 may enable an application to develop, schedule, manage, and monitor batch job associated with the journey view. For example, the journey view batch server may process the location data and develop or present a journey view based on the location data. In one embodiment, the feature recognition batch server 211 may enable an application to develop, schedule, manage, and monitor batch job associated with feature recognition. For example, the feature recognition batch server 211 may process the location data and recognize features associated with a location, based on the location data.

Figure 3:
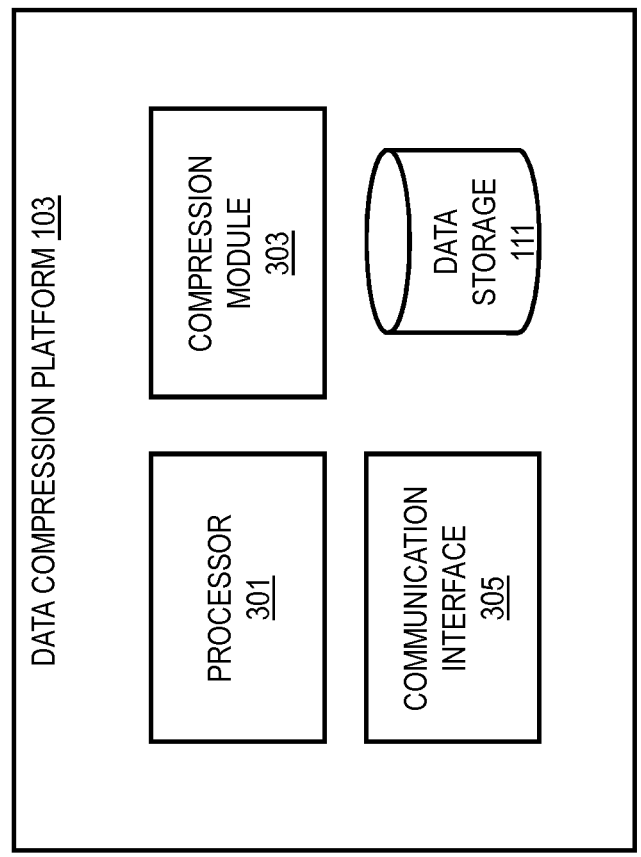
FIG. 3 is a diagram of the components of a data compression platform, according to one embodiment.

FIG. 3 is a diagram of the components of the data compression platform 103, according to one embodiment. By way of example, the data compression platform 103 includes one or more components for providing a compressed data structure of data records sharing one or more common values. It is contemplated that the functions of these components may be combined in one or more components or performed by other components of equivalent functionality. In this embodiment, the data compression platform 103 includes a processor 301, a compression module 303, a communication interface 305, and a the data storage 111.

In one embodiment, the processor 301 may perform a set of operations on information as specified by computer program code related to provide a compressed data structure of data records sharing one or more common values. The computer program code may be a set of instructions or statements providing instructions for the operation of the processor and/or the computer system to perform specified functions.

In one embodiment, the compression module 303 may determine one or more repeating values common across data records and non-repeating values of the data records via the processor 301. The compression module 303 may cause storage of the repeating value in a header record of a data structure and the non-repeating values in point records of the data structure. In one embodiment, the compression module 303 may, by the processor 301, cause grouping of the repeating value based on field types and determine the size of the grouping. The compression module 303 may also cause storage of the size and/or other related information in the header record. The compression module 303 may further cause organization of the header record and/or respective point records as hierarchies based on the field types. Further, in one embodiment, the compression module 303 may, by the processor 301, determine that other data records do not share the repeating value and determine other repeating value common across the other data records. The compression module 303 may cause storage of the other repeating value in other header record of the data structure and the other non-repeating value of the other data records in respective other point records of the data structure.

In one embodiment, the communication interface 305 may enable the data compression platform 103 to communicate with other components of the system 100. For example, the communication interface 305 may allow the data compression platform 103 to transfer the compressed data to the UE 101, the data collection device 107, the data management service 109, and/or the data storage 111 over the communication network 105.

Figure 4A:
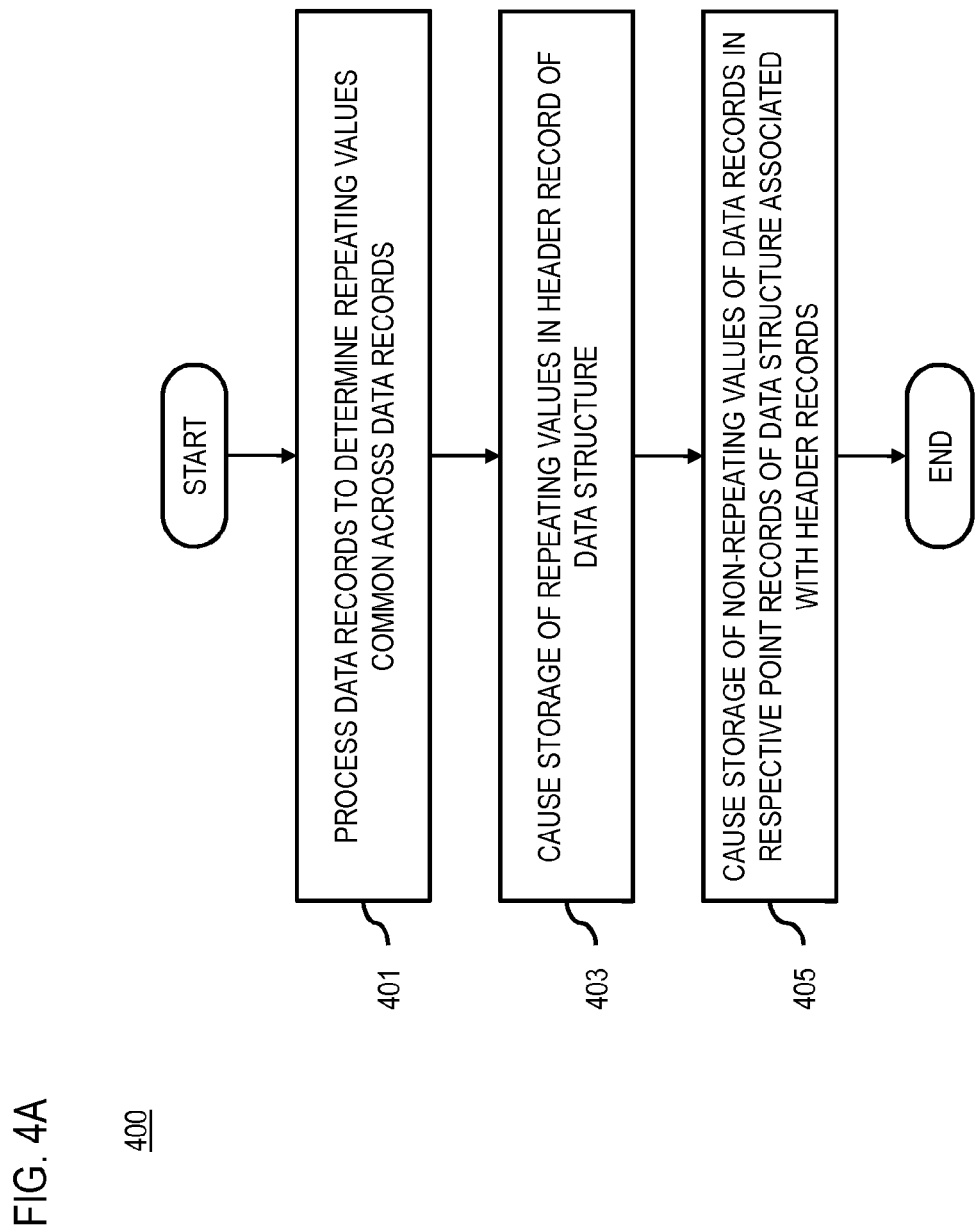
FIG. 4A is a flowchart of a process for providing a compressed data structure of data records sharing one or more common values, according to one embodiment.
Figure 6:
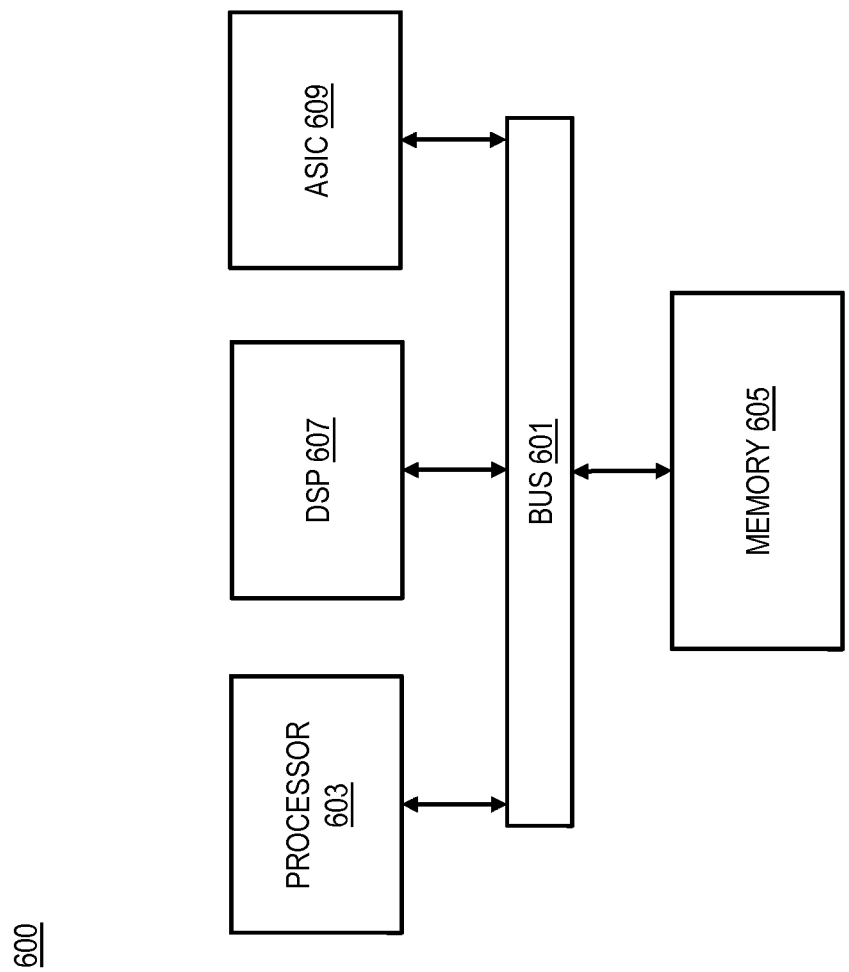
FIG. 6 is a diagram of a chip set that can be used to implement an embodiment of the invention.

FIG. 4A is a flowchart of a process for providing a compressed data structure of data records sharing one or more common values, according to one embodiment. In one embodiment, the data compression platform 103 may perform the process 400 and may be implemented in, for instance, a chip set including a processor and a memory as shown in FIG. 6.

In step 401, the data compression platform 103 may process and/or facilitate a processing of a plurality of data records to determine one or more repeating values common across the plurality of data records. In one embodiment, the plurality of data records may include, at least in part, location-based data and/or the location coordinate information. In one embodiment, the location-based data may include, at least in part, Light Detection and Ranging (LiDAR) data and/or Inertial Measurement Unit (IMU) data. In one embodiment, the location coordinate information may include, at least in part, longitude information, latitude information, and/or altitude information. The data records may include location data records containing coordinates information associated with one or more locations. An exemplary scenario is illustrated as following:

R1: Willis Tower|41.8789° N (or 41°53'44" N) and 87.6358° W (or 87°38'88" W);

R2: Chicago Water Tower|41.8971° N (or 41°53'49" N) and 87.6577° W (or 87°39'27" W);

R3: Chicago Opera House|41.8830° N (or 41°52'58" N) and 87.6313° W (or 87°37'52.68" W).

As illustrated above, the first location data record (R1) is associated with Willis Tower (in Chicago, Ill.) and contain geographical coordinates of 41.8789° N (or 41°53'44" N) and 87.6358° W (or 87°38'88" W); the second location data record (R2) is associated with Chicago Water Tower and contain geographical coordinates of 41.8971° N (or 41°53'49" N) and 87.6577° W (or 87°39'27" W); and the third location data record (R3) is associated with Chicago Opera House and contain geographical coordinates of 41.8830° N (or 41°52'58" N) and 87.6313° W (or 87°37'52" W). The data compression platform 103 may analyze the three location data records (e.g., R1-R3) and determine that a value 41.8° N and a value 87.6° W are common across the location data records. For simplicity of demonstrating examples below, values 41° N and 87° W are used for the common values 41.8° N and 87.6° W.

In step 403, the data compression platform 103 may cause, at least in part, a storage of the one or more repeating values in at least one header record of a data structure. For example, the common values (e.g., 41° N and 87° W) determined in step 401 may be stored in the header record of the data structure. The header record may be a data field placed at the beginning of the block of data. The header record may be represented in bits as following example:

Bit 1-Bit $b_3$: 1|1|101001|0|1010111|10110000;

Bit 1: Header or Point record identifier (e.g., 1=Header, 0=Point);

Bit 2: Longitude directional (e.g., 1=North, 0=South);

Bit 3-Bit $b_1$-1: Repeated portion of Longitude value (e.g., 101001=41);

Bit $b_1$: Latitude directional (e.g., 1=East, 0=West);

Bit $b_1+1$-Bit $b_2$: Repeated portion of Latitude value (e.g., 1010111=87);

Bit $b_2+1$-Bit $b_3$: Altitude (e.g., 10110000=176 m).

As shown in the above example, the header record may be represented in Bit 1 through Bit $b_3$. Bit 1 may represent a type of record (e.g., 1=Header record, 0=Point record). Next bit, Bit 2 may represent a longitude direction (e.g., 1=North, 0=South). Next bits, Bit 3 through Bit $b_1$-1 may represent a repeated portion of a longitude value (e.g., 101001=41). Next bit, Bit $b_1$ may represent latitude direction (e.g., 1=East, 0=West). Next bits, Bit $b_1+1$ through Bit $b_2$ may represent repeated portion of a latitude value (e.g., 1010111=87). Next bits, Bit $b_2+1$ through Bit $b_3$ may represent an altitude value (e.g., 10110000=176 m).

In step 405, the data compression platform 103 may cause, at least in part, a storage of one or more non-repeating values of the plurality of data records in respective one or more point records of the data structure associated with the at least one header record. For example, the coordinates of the three locations analyzed in step 401 (e.g., 41.8789° N and 87.6358° W; 41.8971° N and 87.6577° W; 41.8830° N and 87.6313° W) minus common values (e.g., 41° N and 87° W) determined in step 401 may be point values or non-repeating values (e.g., 0.8789° and 0.6358°; 0.8971° and 0.6577°; 0.8830° and 0.6313°). The point values or non-repeating values may be store in point records of the data structure. The point records may be a data field following the header record or placed at the body of a block of data. The point records may be represented in bits as following example:

Bit 1-Bit $c_3$: 0|10001001010101|11000110101101110011;

Bit 1: Header or Point record identifier (e.g., 1=Header, 0=Point);

Bit 2-Bit $c_1$: Non-repeated portion of Longitude value (e.g., 10001001010101=8789);

Bit $c_1+1$-Bit $c_2$: Non-repeated portion of Latitude value (e.g., 1100011010110=6358);

Bit $c_2+1$ t-Bit $c_3$: Decimal portion of Altitude value (e.g., 110011=51).

As shown in the above example, each point record may be represented in Bit 1 through Bit c3. Bit 1 may represent a type of record (e.g., 1=Header record, 0=Point record). Next bits, Bit 2 through Bit c1 may represent a non-repeated portion of the longitude value (e.g., 10001001010101=8789). Next bits, Bit $c_1+1$ through Bit $c_2$ may represent a non-repeated portion of the latitude value (e.g., 1100011010110=6358). Next bits, Bit $c_2+1$ through Bit $c_3$ may represent a decimal portion of the altitude value (e.g., 110011=51).

In one embodiment, the header record may be followed by a series of the point records associated with the header record. For example, a header record HR1 may be followed by a series of point records PR11, PR12 . . . PR1n, and another header record HR2 may be following by other series of point records PR21, PR22 . . . PR2m. Further, for instance, where there are 100 data records, each of which contains 8 bits of a repeating (common) value and 12 bits of a non-repeating (uncommon) value, the 100 data records would normally require about 2000 bits (100×(8 bits+12 bits)) of storage. However, by storing the repeating value in the header record and the non-repeating values in the point records, storage of the 100 records may require only about 1208 bits (8 bits+(100×12 bits)) of storage. In this case, the data structure can save almost 40% of the data storage and the network bandwidth.

FIG. 4B is a flowchart of a process for grouping and organizing header records of a data structure, according to one embodiment. In one embodiment, the data compression platform 103 may perform the process 430 and may be implemented in, for instance, a chip set including a processor and a memory as shown in FIG. 6.

In step 431, the data compression platform 103 may cause, at least in part, a grouping of the one or more repeating values based, at least in part, on one or more field types. In one embodiment, the one or more field types may relate, at least in part, to the location coordinate information (e.g., longitude, latitude, altitude). For example, in continuation of the previous exemplary scenario, the common values (e.g., 41° N and 87° W) determined in step 401 may be grouped together. In other words, the common values (e.g., 41° N and 87° W) of the first location data record may be grouped with the common values (e.g., 41° N and 87° W) of the second and third location data records. Thus, in this exemplary scenario, there may be a group consist of three sets of 41° N and 87° W from the three location data records (e.g., R1-R3).

In step 433, the data compression platform 103 may determine a size of the grouping based, at least in part, on a geographical area represented by the location-based data, and a repetition of one or more location coordinate values corresponding to the geographical area. For example, assuming that there are 100 locations data records sharing one or more common values (e.g., 41° N and 87° W), the 100 location data records or the coordinate information (e.g., 41° N and 87° W) associated with the 100 location data records may represent a geographical area that covers Chicago downtown area. Based on the number of the location data records or the repeated common values that represents the geographical area, the size of the group containing the 100 sharing values (e.g., 41° N and 87° W) may be determined. Since the location data records within a smaller geographical area may have more shared common values among the location data records, the size of a group representing the smaller geographical area may be larger than the size of other group representing a larger geographical area.

In step 435, the data compression platform 103 may cause, at least in part, a storage of the size, other related information, or a combination thereof associated with the geographical area in the at least one header record. The size of the common value group determined in step 433 other related information (e.g., geographical area covered, coordinates of the geographical area, hierarchical level of the common value group, number of location data records associated with the common value group, etc.) may be stored in the header records of the data structure. For example, the size of the common value group in the above example (e.g., size 100) may be stored in the header record of the data structure along with other related information (Chicago downtown area, 41° N and 87° W, level 4, 100 location data records, etc.).

In step 437, the data compression platform 103 may cause, at least in part, an organization of the at least one header record, the respective one or more point records, or a combination thereof as one or more hierarchies based, at least in part, on the one or more field types. In one embodiment, the header records and/or the point records of the data structure may be organized in hierarchies. The header records and point records may be ranked based on their field types (e.g., latitude, longitude, altitude, etc.). In other words, the header records (or the point records) may have sub-headers (or sub-point records) stored with common values across the header records (or the point records). For example, assume there are five header records associated with following values:

HR1: 41°1 N, 87°1 W;
HR2: 41.12° N, 87.12° W;
HR3: 41.123° N, 87.1231° W;
HR4: 41.1234° N, 87.12345° W;
HR5: 41.12345° N, 87.12345° W.

The header records HR1-HR5 shares common values 41°1 N and 87°1 W. Thus, HR1 (e.g., 41°1 N and 87°1 W) may become a sub-header of the header records HR1-HR5 and HR2-HR5 may become point records of the header records HR1-HR5 associated with the sub-header HR1. Again, among HR2-HR5, common values may be 41°12 N and 87°12 W. Thus, HR2 (e.g., 41°12 N and 87°12 W) may become a sub-header of HR2-HR5 and HR3-HR5 may become point records of HR2-HR5 associated with the sub-header H2. This step may be repeated as long as there are common values among the header records or the point records at any level. The header record or the point record at each level may correspond to a level of the hierarchies.

Figure 4C:
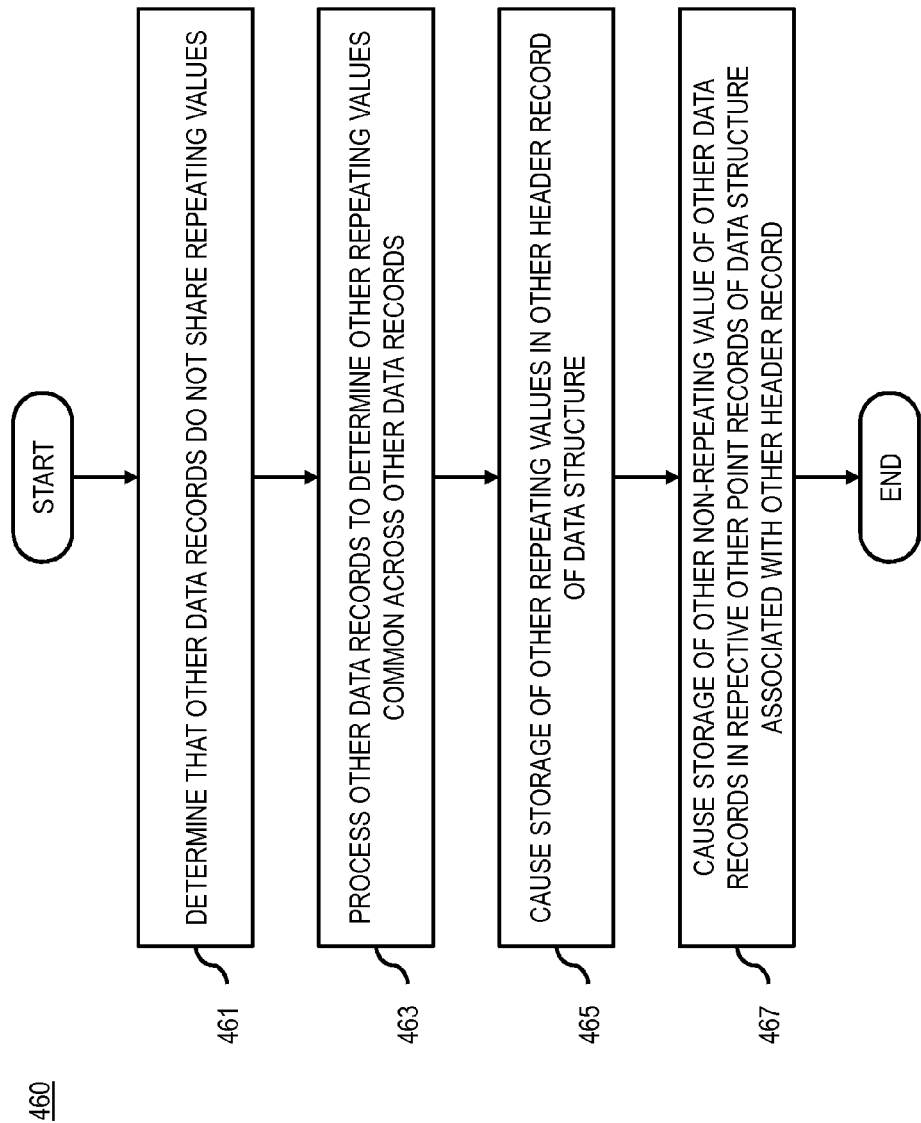
FIG. 4C is a flowchart of a process for creating a new header records for other data records that do not share repeating values with the data records, according to one embodiment.

FIG. 4C is a flowchart of a process for creating a new header records for other data records that do not share repeating values with the data records, according to one embodiment. In one embodiment, the data compression platform 103 may perform the process 460 and may be implemented in, for instance, a chip set including a processor and a memory as shown in FIG. 6.

In step 461, the data compression platform 103 may determine that a plurality of other data records do not share the one or more repeating values. The other data records may also include location data records containing coordinates information associated with locations. Following example is continuation of the above exemplary scenario:

R4: Ford Field|42.3400° N (or 42°20'24" N) and 83.0455° W (or 83°02'44" W);
R5: Renaissance Center|42.3289° N (or 42°19'44" N) and 83.0397° W (or 83°02'22' W).

As shown in the above example, the forth location data record associated with Ford Field (in Detroit, Mich.) may contain coordinates of 42.3400° N (or 42°20'24" N) and 83.0455° W (or 83°02'44" W); and a fifth location data record associated with GM Renaissance Center may contain coordinates of 42.3289° N (or 42°19'44" N) and 83.0397° W (or 83°02'22" W). The data compression platform 103 may analyze these location data records and determine that the fourth location data record and the fifth location data record do not share the repeating values (e.g., 41° N and 87° W) determined in step 401, which are common across the first three data records (e.g., R1-R3).

In step 463, the data compression platform 103 may process and/or facilitate a processing of the plurality of other data records to determine one or more other repeating values common across the plurality of other data records. For example, the data compression platform 103 may analyze the fourth and the firth location data records in step 461 and determine that a value 42° N and a value 83° W are common across the fourth and fifth location data records (e.g., R4-R5).

In step 465, the data compression platform 103 may cause, at least in part, a storage of the one or more other repeating values in at least one other header record of the data structure. For example, the other common values (e.g., 42° N and 83° W) determined in step 463 may be stored in another header record of the data structure. The other header record may be represented in bits, similarly as the bit representation of the header record described above in regard to step 403.

In step 467, the data compression platform 103 may cause, at least in part, a storage of one or more other non-repeating values of the plurality of other data records in respective one or more other point records of the data structure associated with the at least one other header record. For example, the coordinates of the two locations analyzed in step 461 (e.g. 42.3400.degree. N and 83.0455.degree. W; 42.3289.degree. N and 83.0397.degree. W) minus common values (e.g., 42.degree. N and 83.degree. W) determined in step 461 may be other point values or other non-repeating values (e.g., 0.3400.degree. and 0.0455.degree.; 0.3289.degree. and 0.0397.degree.). The other point values or other non-repeating values may be stored in other point records of the data structure. The other point records may be represented in bits, similarly as the bit representation of the point records described above in regard to step 405.

The processes described herein for providing a compressed data structure of data records sharing one or more common values may be advantageously implemented via software, hardware, firmware or a combination of software and/or firmware and/or hardware. For example, the processes described herein, may be advantageously implemented via processor(s), Digital Signal Processing (DSP) chip, an Application Specific Integrated Circuit (ASIC), Field Programmable Gate Arrays (FPGAs), etc. Such exemplary hardware for performing the described functions is detailed below.

Figure 5:
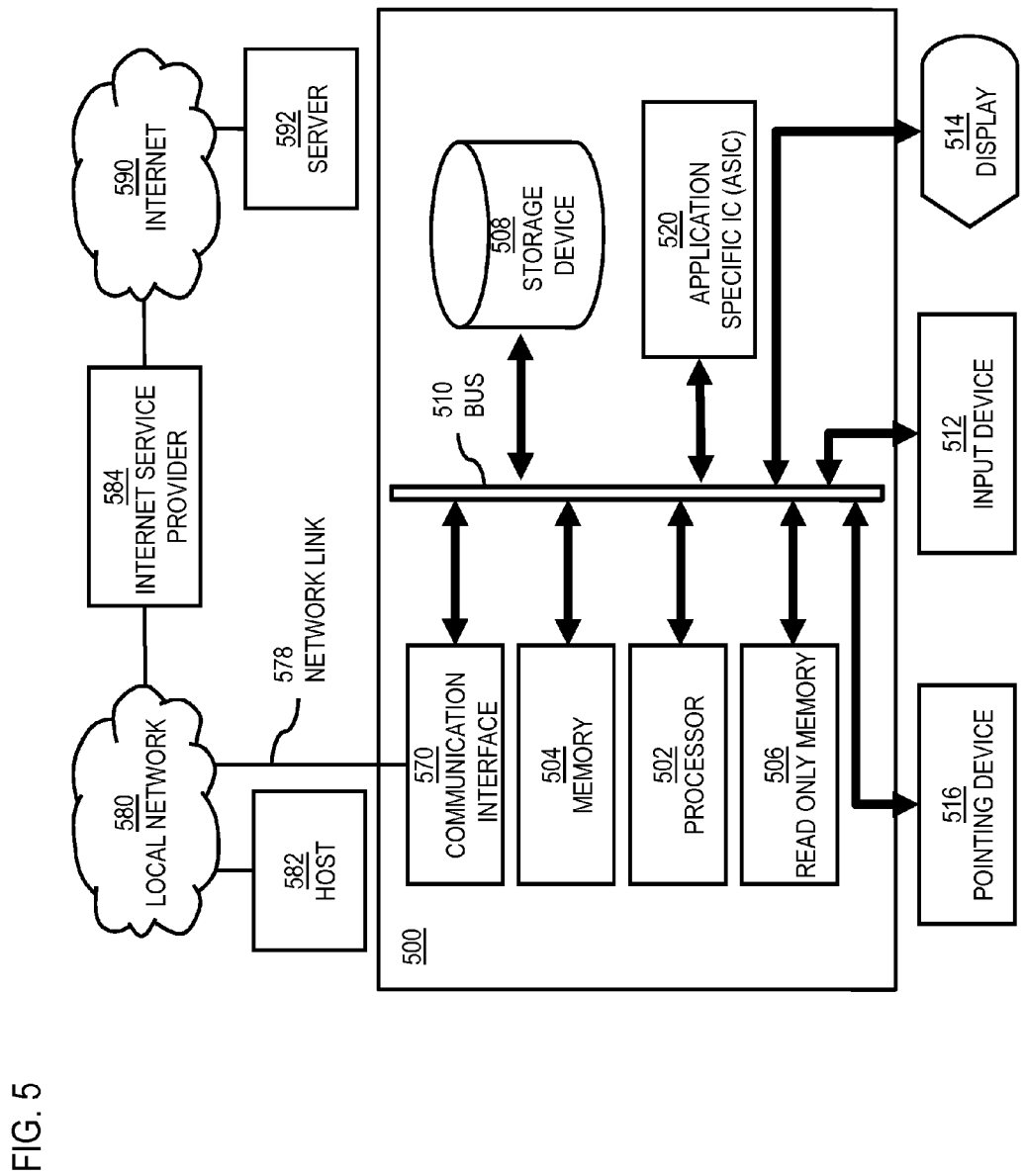
FIG. 5 is a diagram of hardware that can be used to implement an embodiment of the invention.

FIG. 5 illustrates a computer system 500 upon which an embodiment of the invention may be implemented. Although computer system 500 is depicted with respect to a particular device or equipment, it is contemplated that other devices or equipment (e.g., network elements, servers, etc.) within FIG. 5 can deploy the illustrated hardware and components of system 500. Computer system 500 is programmed (e.g., via computer program code or instructions) to provide a compressed data structure of data records sharing one or more common values as described herein and includes a communication mechanism such as a bus 510 for passing information between other internal and external components of the computer system 500. Information (also called data) is represented as a physical expression of a measurable phenomenon, typically electric voltages, but including, in other embodiments, such phenomena as magnetic, electromagnetic, pressure, chemical, biological, molecular, atomic, sub-atomic and quantum interactions. For example, north and south magnetic fields, or a zero and non-zero electric voltage, represent two states (0, 1) of a binary digit (bit). Other phenomena can represent digits of a higher base. A superposition of multiple simultaneous quantum states before measurement represents a quantum bit (qubit). A sequence of one or more digits constitutes digital data that is used to represent a number or code for a character. In some embodiments, information called analog data is represented by a near continuum of measurable values within a particular range. Computer system 500, or a portion thereof, constitutes a means for performing one or more steps of providing a compressed data structure of data records sharing one or more common values.

A bus 510 includes one or more parallel conductors of information so that information is transferred quickly among devices coupled to the bus 510. One or more processors 502 for processing information are coupled with the bus 510.

A processor (or multiple processors) 502 performs a set of operations on information as specified by computer program code related to provide a compressed data structure of data records sharing one or more common values. The computer program code is a set of instructions or statements providing instructions for the operation of the processor and/or the computer system to perform specified functions. The code, for example, may be written in a computer programming language that is compiled into a native instruction set of the processor. The code may also be written directly using the native instruction set (e.g., machine language). The set of operations include bringing information in from the bus 510 and placing information on the bus 510. The set of operations also typically include comparing two or more units of information, shifting positions of units of information, and combining two or more units of information, such as by addition or multiplication or logical operations like OR, exclusive OR (XOR), and AND. Each operation of the set of operations that can be performed by the processor is represented to the processor by information called instructions, such as an operation code of one or more digits. A sequence of operations to be executed by the processor 502, such as a sequence of operation codes, constitute processor instructions, also called computer system instructions or, simply, computer instructions. Processors may be implemented as mechanical, electrical, magnetic, optical, chemical or quantum components, among others, alone or in combination.

Computer system 500 also includes a memory 504 coupled to bus 510. The memory 504, such as a random access memory (RAM) or any other dynamic storage device, stores information including processor instructions for providing a compressed data structure of data records sharing one or more common values. Dynamic memory allows information stored therein to be changed by the computer system 500. RAM allows a unit of information stored at a location called a memory address to be stored and retrieved independently of information at neighboring addresses. The memory 504 is also used by the processor 502 to store temporary values during execution of processor instructions. The computer system 500 also includes a read only memory (ROM) 506 or any other static storage device coupled to the bus 510 for storing static information, including instructions, that is not changed by the computer system 500. Some memory is composed of volatile storage that loses the information stored thereon when power is lost. Also coupled to bus 510 is a non-volatile (persistent) storage device 508, such as a magnetic disk, optical disk or flash card, for storing information, including instructions, that persists even when the computer system 500 is turned off or otherwise loses power.

Information, including instructions for providing a compressed data structure of data records sharing one or more common values, is provided to the bus 510 for use by the processor from an external input device 512, such as a keyboard containing alphanumeric keys operated by a human user, a microphone, an Infrared (IR) remote control, a joystick, a game pad, a stylus pen, a touch screen, or a sensor. A sensor detects conditions in its vicinity and transforms those detections into physical expression compatible with the measurable phenomenon used to represent information in computer system 500. Other external devices coupled to bus 510, used primarily for interacting with humans, include a display device 514, such as a cathode ray tube (CRT), a liquid crystal display (LCD), a light emitting diode (LED) display, an organic LED (OLED) display, a plasma screen, or a printer for presenting text or images, and a pointing device 516, such as a mouse, a trackball, cursor direction keys, or a motion sensor, for controlling a position of a small cursor image presented on the display 514 and issuing commands associated with graphical elements presented on the display 514. In some embodiments, for example, in embodiments in which the computer system 500 performs all functions automatically without human input, one or more of external input device 512, display device 514 and pointing device 516 is omitted.

In the illustrated embodiment, special purpose hardware, such as an application specific integrated circuit (ASIC) 520, is coupled to bus 510. The special purpose hardware is configured to perform operations not performed by processor 502 quickly enough for special purposes. Examples of ASICs include graphics accelerator cards for generating images for display 514, cryptographic boards for encrypting and decrypting messages sent over a network, speech recognition, and interfaces to special external devices, such as robotic arms and medical scanning equipment that repeatedly perform some complex sequence of operations that are more efficiently implemented in hardware.

Computer system 500 also includes one or more instances of a communications interface 570 coupled to bus 510. Communication interface 570 provides a one-way or two-way communication coupling to a variety of external devices that operate with their own processors, such as printers, scanners and external disks. In general the coupling is with a network link 578 that is connected to a local network 580 to which a variety of external devices with their own processors are connected. For example, communication interface 570 may be a parallel port or a serial port or a universal serial bus (USB) port on a personal computer. In some embodiments, communications interface 570 is an integrated services digital network (ISDN) card or a digital subscriber line (DSL) card or a telephone modem that provides an information communication connection to a corresponding type of telephone line. In some embodiments, a communication interface 570 is a cable modem that converts signals on bus 510 into signals for a communication connection over a coaxial cable or into optical signals for a communication connection over a fiber optic cable. As another example, communications interface 570 may be a local area network (LAN) card to provide a data communication connection to a compatible LAN, such as Ethernet. Wireless links may also be implemented. For wireless links, the communications interface 570 sends or receives or both sends and receives electrical, acoustic or electromagnetic signals, including infrared and optical signals, that carry information streams, such as digital data. For example, in wireless handheld devices, such as mobile telephones like cell phones, the communications interface 570 includes a radio band electromagnetic transmitter and receiver called a radio transceiver. In certain embodiments, the communications interface 570 enables connection to the communication network 105 for providing a compressed data structure of data records sharing one or more common values to the UE 101.

The term "computer-readable medium" as used herein refers to any medium that participates in providing information to processor 502, including instructions for execution. Such a medium may take many forms, including, but not limited to computer-readable storage medium (e.g., non-volatile media, volatile media), and transmission media. Non-transitory media, such as non-volatile media, include, for example, optical or magnetic disks, such as storage device 508. Volatile media include, for example, dynamic memory 504. Transmission media include, for example, twisted pair cables, coaxial cables, copper wire, fiber optic cables, and carrier waves that travel through space without wires or cables, such as acoustic waves and electromagnetic waves, including radio, optical and infrared waves. Signals include man-made transient variations in amplitude, frequency, phase, polarization or other physical properties transmitted through the transmission media. Common forms of computer-readable media include, for example, a floppy disk, a flexible disk, hard disk, magnetic tape, any other magnetic medium, a CD-ROM, CDRW, DVD, any other optical medium, punch cards, paper tape, optical mark sheets, any other physical medium with patterns of holes or other optically recognizable indicia, a RAM, a PROM, an EPROM, a FLASH-EPROM, an EEPROM, a flash memory, any other memory chip or cartridge, a carrier wave, or any other medium from which a computer can read. The term computer-readable storage medium is used herein to refer to any computer-readable medium except transmission media.

Logic encoded in one or more tangible media includes one or both of processor instructions on a computer-readable storage media and special purpose hardware, such as ASIC 520.

Network link 578 typically provides information communication using transmission media through one or more networks to other devices that use or process the information. For example, network link 578 may provide a connection through local network 580 to a host computer 582 or to equipment 584 operated by an Internet Service Provider (ISP). ISP equipment 584 in turn provides data communication services through the public, world-wide packet-switching communication network of networks now commonly referred to as the Internet 590.

A computer called a server host 592 connected to the Internet hosts a process that provides a service in response to information received over the Internet. For example, server host 592 hosts a process that provides information representing video data for presentation at display 514. It is contemplated that the components of computer system 500 can be deployed in various configurations within other computer systems, e.g., host 582 and server 592.

At least some embodiments of the invention are related to the use of computer system 500 for implementing some or all of the techniques described herein. According to one embodiment of the invention, those techniques are performed by computer system 500 in response to processor 502 executing one or more sequences of one or more processor instructions contained in memory 504. Such instructions, also called computer instructions, software and program code, may be read into memory 504 from another computer-readable medium such as storage device 508 or network link 578. Execution of the sequences of instructions contained in memory 504 causes processor 502 to perform one or more of the method steps described herein. In alternative embodiments, hardware, such as ASIC 520, may be used in place of or in combination with software to implement the invention. Thus, embodiments of the invention are not limited to any specific combination of hardware and software, unless otherwise explicitly stated herein.

The signals transmitted over network link 578 and other networks through communications interface 570, carry information to and from computer system 500. Computer system 500 can send and receive information, including program code, through the networks 580, 590 among others, through network link 578 and communications interface 570. In an example using the Internet 590, a server host 592 transmits program code for a particular application, requested by a message sent from computer system 500, through Internet 590, ISP equipment 584, local network 580 and communications interface 570. The received code may be executed by processor 502 as it is received, or may be stored in memory 504 or in storage device 508 or any other non-volatile storage for later execution, or both. In this manner, computer system 500 may obtain application program code in the form of signals on a carrier wave.

Various forms of computer readable media may be involved in carrying one or more sequence of instructions or data or both to processor 502 for execution. For example, instructions and data may initially be carried on a magnetic disk of a remote computer such as host 582. The remote computer loads the instructions and data into its dynamic memory and sends the instructions and data over a telephone line using a modem. A modem local to the computer system 500 receives the instructions and data on a telephone line and uses an infra-red transmitter to convert the instructions and data to a signal on an infra-red carrier wave serving as the network link 578. An infrared detector serving as communications interface 570 receives the instructions and data carried in the infrared signal and places information representing the instructions and data onto bus 510. Bus 510 carries the information to memory 504 from which processor 502 retrieves and executes the instructions using some of the data sent with the instructions. The instructions and data received in memory 504 may optionally be stored on storage device 508, either before or after execution by the processor 502.

FIG. 6 illustrates a chip set or chip 600 upon which an embodiment of the invention may be implemented. Chip set 600 is programmed to provide a compressed data structure of data records sharing one or more common values as described herein and includes, for instance, the processor and memory components described with respect to FIG. 5 incorporated in one or more physical packages (e.g., chips). By way of example, a physical package includes an arrangement of one or more materials, components, and/or wires on a structural assembly (e.g., a baseboard) to provide one or more characteristics such as physical strength, conservation of size, and/or limitation of electrical interaction. It is contemplated that in certain embodiments the chip set 600 can be implemented in a single chip. It is further contemplated that in certain embodiments the chip set or chip 600 can be implemented as a single "system on a chip." It is further contemplated that in certain embodiments a separate ASIC would not be used, for example, and that all relevant functions as disclosed herein would be performed by a processor or processors. Chip set or chip 600, or a portion thereof, constitutes a means for performing one or more steps of providing user interface navigation information associated with the availability of functions. Chip set or chip 600, or a portion thereof, constitutes a means for performing one or more steps of providing a compressed data structure of data records sharing one or more common values.

In one embodiment, the chip set or chip 600 includes a communication mechanism such as a bus 601 for passing information among the components of the chip set 600. A processor 603 has connectivity to the bus 601 to execute instructions and process information stored in, for example, a memory 605. The processor 603 may include one or more processing cores with each core configured to perform independently. A multi-core processor enables multiprocessing within a single physical package. Examples of a multi-core processor include two, four, eight, or greater numbers of processing cores. Alternatively or in addition, the processor 603 may include one or more microprocessors configured in tandem via the bus 601 to enable independent execution of instructions, pipelining, and multithreading. The processor 603 may also be accompanied with one or more specialized components to perform certain processing functions and tasks such as one or more digital signal processors (DSP) 607, or one or more application-specific integrated circuits (ASIC) 609. A DSP 607 typically is configured to process real-world signals (e.g., sound) in real time independently of the processor 603. Similarly, an ASIC 609 can be configured to performed specialized functions not easily performed by a more general purpose processor. Other specialized components to aid in performing the inventive functions described herein may include one or more field programmable gate arrays (FPGA), one or more controllers, or one or more other special-purpose computer chips.

In one embodiment, the chip set or chip 600 includes merely one or more processors and some software and/or firmware supporting and/or relating to and/or for the one or more processors.

The processor 603 and accompanying components have connectivity to the memory 605 via the bus 601. The memory 605 includes both dynamic memory (e.g., RAM, magnetic disk, writable optical disk, etc.) and static memory (e.g., ROM, CD-ROM, etc.) for storing executable instructions that when executed perform the inventive steps described herein to provide a compressed data structure of data records sharing one or more common values. The memory 605 also stores the data associated with or generated by the execution of the inventive steps.

Figure 7:
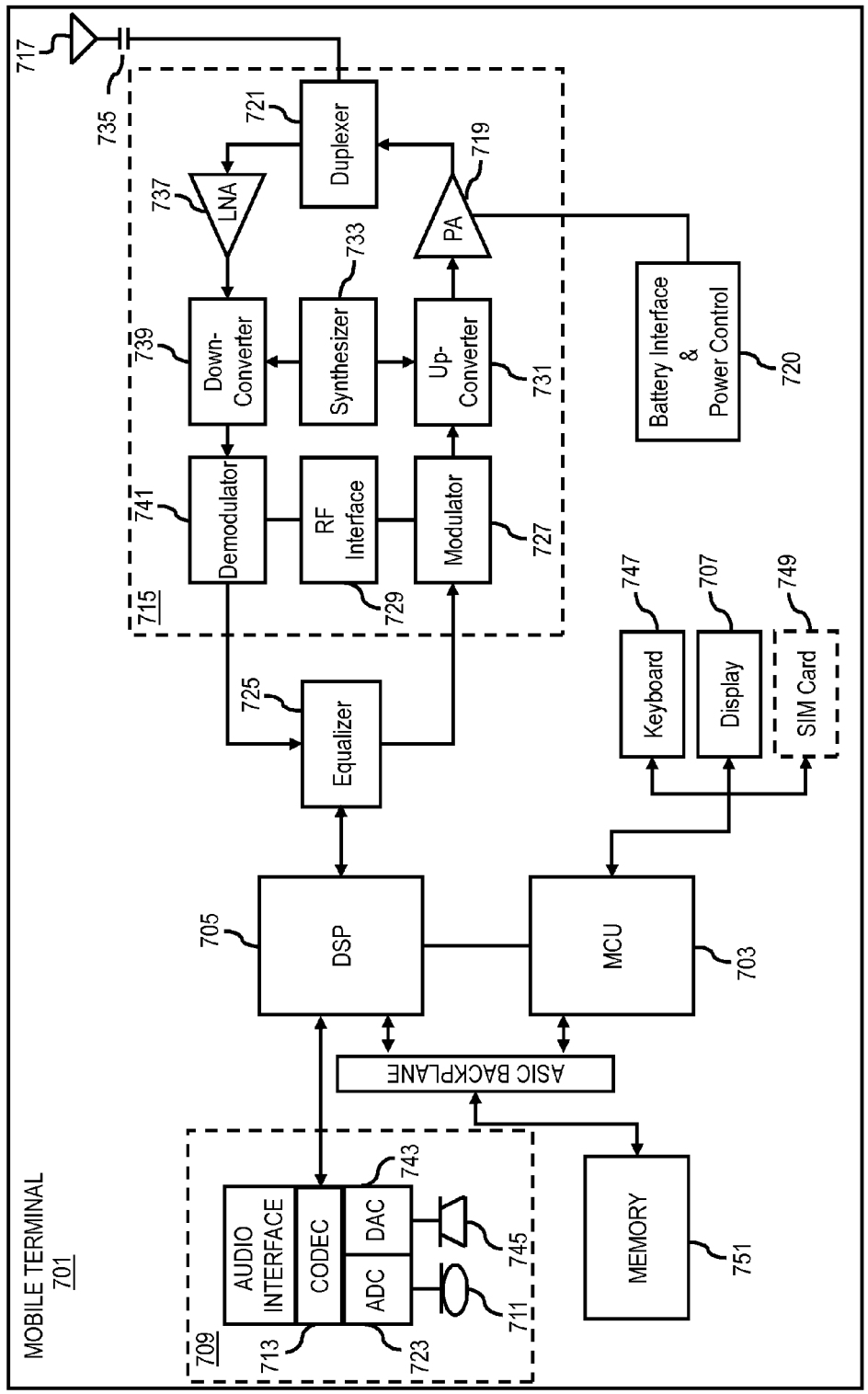
FIG. 7 is a diagram of a mobile terminal (e.g., handset) that can be used to implement an embodiment of the invention.

FIG. 7 is a diagram of exemplary components of a mobile terminal (e.g., handset) for communications, which is capable of operating in the system of FIG. 1, according to one embodiment. In some embodiments, mobile terminal 701, or a portion thereof, constitutes a means for performing one or more steps of providing a compressed data structure of data records sharing one or more common values. Generally, a radio receiver is often defined in terms of front-end and back-end characteristics. The front-end of the receiver encompasses all of the Radio Frequency (RF) circuitry whereas the back-end encompasses all of the base-band processing circuitry. As used in this application, the term "circuitry" refers to both: (1) hardware-only implementations (such as implementations in only analog and/or digital circuitry), and (2) to combinations of circuitry and software (and/or firmware) (such as, if applicable to the particular context, to a combination of processor(s), including digital signal processor(s), software, and memory(ies) that work together to cause an apparatus, such as a mobile phone or server, to perform various functions). This definition of "circuitry" applies to all uses of this term in this application, including in any claims. As a further example, as used in this application and if applicable to the particular context, the term "circuitry" would also cover an implementation of merely a processor (or multiple processors) and its (or their) accompanying software/or firmware. The term "circuitry" would also cover if applicable to the particular context, for example, a baseband integrated circuit or applications processor integrated circuit in a mobile phone or a similar integrated circuit in a cellular network device or other network devices.

Pertinent internal components of the telephone include a Main Control Unit (MCU) 703, a Digital Signal Processor (DSP) 705, and a receiver/transmitter unit including a microphone gain control unit and a speaker gain control unit. A main display unit 707 provides a display to the user in support of various applications and mobile terminal functions that perform or support the steps of providing a compressed data structure of data records sharing one or more common values. The display 707 includes display circuitry configured to display at least a portion of a user interface of the mobile terminal (e.g., mobile telephone). Additionally, the display 707 and display circuitry are configured to facilitate user control of at least some functions of the mobile terminal. An audio function circuitry 709 includes a microphone 711 and microphone amplifier that amplifies the speech signal output from the microphone 711. The amplified speech signal output from the microphone 711 is fed to a coder/decoder (CODEC) 713.

A radio section 715 amplifies power and converts frequency in order to communicate with a base station, which is included in a mobile communication system, via antenna 717. The power amplifier (PA) 719 and the transmitter/modulation circuitry are operationally responsive to the MCU 703, with an output from the PA 719 coupled to the duplexer 721 or circulator or antenna switch, as known in the art. The PA 719 also couples to a battery interface and power control unit 720.

In use, a user of mobile terminal 701 speaks into the microphone 711 and his or her voice along with any detected background noise is converted into an analog voltage. The analog voltage is then converted into a digital signal through the Analog to Digital Converter (ADC) 723. The control unit 703 routes the digital signal into the DSP 705 for processing therein, such as speech encoding, channel encoding, encrypting, and interleaving. In one embodiment, the processed voice signals are encoded, by units not separately shown, using a cellular transmission protocol such as enhanced data rates for global evolution (EDGE), general packet radio service (GPRS), global system for mobile communications (GSM), Internet protocol multimedia subsystem (IMS), universal mobile telecommunications system (UMTS), etc., as well as any other suitable wireless medium, e.g., microwave access (WiMAX), Long Term Evolution (LTE) networks, code division multiple access (CDMA), wideband code division multiple access (WCDMA), wireless fidelity (WiFi), satellite, and the like, or any combination thereof.

The encoded signals are then routed to an equalizer 725 for compensation of any frequency-dependent impairments that occur during transmission though the air such as phase and amplitude distortion. After equalizing the bit stream, the modulator 727 combines the signal with a RF signal generated in the RF interface 729. The modulator 727 generates a sine wave by way of frequency or phase modulation. In order to prepare the signal for transmission, an up-converter 731 combines the sine wave output from the modulator 727 with another sine wave generated by a synthesizer 733 to achieve the desired frequency of transmission. The signal is then sent through a PA 719 to increase the signal to an appropriate power level. In practical systems, the PA 719 acts as a variable gain amplifier whose gain is controlled by the DSP 705 from information received from a network base station. The signal is then filtered within the duplexer 721 and optionally sent to an antenna coupler 735 to match impedances to provide maximum power transfer. Finally, the signal is transmitted via antenna 717 to a local base station. An automatic gain control (AGC) can be supplied to control the gain of the final stages of the receiver. The signals may be forwarded from there to a remote telephone which may be another cellular telephone, any other mobile phone or a land-line connected to a Public Switched Telephone Network (PSTN), or other telephony networks.

Voice signals transmitted to the mobile terminal 701 are received via antenna 717 and immediately amplified by a low noise amplifier (LNA) 737. A down-converter 739 lowers the carrier frequency while the demodulator 741 strips away the RF leaving only a digital bit stream. The signal then goes through the equalizer 725 and is processed by the DSP 705. A Digital to Analog Converter (DAC) 743 converts the signal and the resulting output is transmitted to the user through the speaker 745, all under control of a Main Control Unit (MCU) 703 which can be implemented as a Central Processing Unit (CPU).

The MCU 703 receives various signals including input signals from the keyboard 747. The keyboard 747 and/or the MCU 703 in combination with other user input components (e.g., the microphone 711) comprise a user interface circuitry for managing user input. The MCU 703 runs a user interface software to facilitate user control of at least some functions of the mobile terminal 701 to provide a compressed data structure of data records sharing one or more common values. The MCU 703 also delivers a display command and a switch command to the display 707 and to the speech output switching controller, respectively. Further, the MCU 703 exchanges information with the DSP 705 and can access an optionally incorporated SIM card 749 and a memory 751. In addition, the MCU 703 executes various control functions required of the terminal. The DSP 705 may, depending upon the implementation, perform any of a variety of conventional digital processing functions on the voice signals. Additionally, DSP 705 determines the background noise level of the local environment from the signals detected by microphone 711 and sets the gain of microphone 711 to a level selected to compensate for the natural tendency of the user of the mobile terminal 701.

The CODEC 713 includes the ADC 723 and DAC 743. The memory 751 stores various data including call incoming tone data and is capable of storing other data including music data received via, e.g., the global Internet. The software module could reside in RAM memory, flash memory, registers, or any other form of writable storage medium known in the art. The memory device 751 may be, but not limited to, a single memory, CD, DVD, ROM, RAM, EEPROM, optical storage, magnetic disk storage, flash memory storage, or any other non-volatile storage medium capable of storing digital data.

An optionally incorporated SIM card 749 carries, for instance, important information, such as the cellular phone number, the carrier supplying service, subscription details, and security information. The SIM card 749 serves primarily to identify the mobile terminal 701 on a radio network. The card 749 also contains a memory for storing a personal telephone number registry, text messages, and user specific mobile terminal settings.

While the invention has been described in connection with a number of embodiments and implementations, the invention is not so limited but covers various obvious modifications and equivalent arrangements, which fall within the purview of the appended claims. Although features of the invention are expressed in certain combinations among the claims, it is contemplated that these features can be arranged in any combination and order.

What is claimed is:

1. A method comprising:
processing, by an apparatus, a plurality of data records to determine one or more repeating portions of values respectively stored in the plurality of data records, wherein the one or more repeating portions are common across the values;
grouping, by the apparatus, the one or more repeating portions of the values based, at least in part, on one or more field types;
initiating, by the apparatus, a storage in a non-transitory memory of the one or more repeating portions of the values in at least one header record of a compressed data structure;
initiating, by the apparatus, a storage in the non-transitory memory of non-repeating portions of the values in respective point records of the compressed data structure that directly follows the at least one header record or within a body of the compressed data structure;
organizing, by the apparatus, the at least one header record, the respective one or more point records, or a combination thereof, into one or more sub-header records or one or more sub-point records, respectively, each stored with at least one common value across the header record or the point records, respectively, as one or more hierarchies based, at least in part, on the one or more field types; and
initiating, by the apparatus, a transmission of a packet comprising a header that contains the one or more repeating portions obtained from the at least one header record and a payload that contains the non-repeating portions obtained from the point records via a network to another apparatus,
wherein the apparatus and the non-transitory memory are embedded in a mobile terminal, and the compressed data structure represents, at least in part, a compressed version of the plurality of data records.

2. A method of claim 1, wherein the plurality of data records includes, at least in part, location-based data, and wherein the one or more field types relate, at least in part, to location coordinate information, wherein the apparatus is a server, and the non-transitory memory is embedded in a network node connected to the server via a network.

3. A method of claim 2, further comprising:
determining a size of the grouping based, at least in part, on a geographical area represented by the location-based data, and a repetition of one or more location coordinate values corresponding to the geographical area.

4. A method of claim 3, further comprising:
storing in the non-transitory memory the size, other related information, or a combination thereof associated with the geographical area in the at least one header record.

5. A method of claim 2, wherein the location-based data includes, at least in part, Light Detection and Ranging (LiDAR) data, Inertial Measurement Unit (IMU) data, or a combination thereof.

6. A method of claim 2, wherein the location coordinate information includes, at least in part, longitude values, latitude values, altitude values, or a combination thereof.

7. A method of claim 6, wherein the one or more repeating portions include respective repeating numerical portions of the longitude values, the latitude values, the altitude values, or a combination thereof; and wherein the non-repeating portions are determined by subtracting the respective repeating numerical portions from the longitude values, the latitude values, the altitude values, or a combination thereof.

8. A method of claim 1, further comprising:
determining that a plurality of other data records does not share the one or more repeating portions of the values;
processing the plurality of other data records to determine one or more other repeating portions of other values common across the plurality of other data records;
storing in the non-transitory memory the one or more other repeating portions of the other values in at least one other header record of the compressed data structure; and
storing in the non-transitory memory one or more other non-repeating portions of the other values of the plurality of other data records in respective one or more other point records of the compressed data structure associated with the at least one other header record.

9. An apparatus comprising:
at least one processor; and
at least one non-transitory memory including computer program code for one or more programs,
the at least one memory and the computer program code configured to, with the at least one processor, cause the apparatus to perform at least the following,
process a plurality of data records to determine one or more repeating portions of values respectively stored in the plurality of data records, wherein the one or more repeating portions are common across the values;
group the one or more repeating portions of the values based, at least in part, on one or more field types;
initiate a storage in a non-transitory memory of the one or more repeating portions of the values in at least one header record of a compressed data structure;
initiate a storage in the non-transitory memory of non-repeating portions of the values in respective point records of the compressed data structure that directly follows the at least one header record or within a body of the compressed data structure;
organize the at least one header record, the respective one or more point records, or a combination thereof, into one or more sub-header records or one or more sub-point records, respectively, each stored with at least one common value across the header record or the point records, respectively, as one or more hierarchies based, at least in part, on the one or more field types; and
initiate a transmission of a packet comprising a header that contains the one or more repeating portions obtained from the at least one header record and a payload that contains the non-repeating portions obtained from the point records via a network to another apparatus,
wherein the apparatus and the non-transitory memory are embedded in a mobile terminal, and wherein the compressed data structure represents, at least in part, a compressed version of the plurality of data records.

10. An apparatus of claim 9, wherein the plurality of data records includes, at least in part, location-based data, and wherein the one or more field types relate, at least in part, to location coordinate information.

11. An apparatus of claim 10, wherein the apparatus is further caused to:
determine a size of the grouping based, at least in part, on a geographical area represented by the location-based data, and a repetition of one or more location coordinate values corresponding to the geographical area.

12. An apparatus of claim 11, wherein the apparatus is further caused to:
store in the memory the size, other related information, or a combination thereof associated with the geographical area in the at least one header record.

13. An apparatus of claim 10, wherein the location-based data includes, at least in part, Light Detection and Ranging (LiDAR) data, Inertial Measurement Unit (IMU) data, or a combination thereof.

14. An apparatus of claim 10, wherein the location coordinate information includes, at least in part, longitude values, latitude values, altitude values, or a combination thereof.

15. An apparatus of claim 9, wherein the apparatus is further caused to:
determine that a plurality of other data records does not share the one or more repeating portions of the values;
process the plurality of other data records to determine one or more other repeating portions of other values common across the plurality of other data records;
store in the memory the one or more other repeating portions of the other values in at least one other header record of the compressed data structure; and
store in the memory one or more other non-repeating portions of the other values of the plurality of other data records in respective one or more other point records of the compressed data structure associated with the at least one other header record.

16. A non-transitory computer readable storage medium carrying one or more sequences of one or more instructions which, when executed by one or more processors, cause an apparatus to at least perform the following steps:
processing a plurality of data records to determine one or more repeating portions of values respectively stored in the plurality of data records, wherein the one or more repeating portions are common across the values;
grouping the one or more repeating portions of the values based, at least in part, on one or more field types;

initiating a storage in a non-transitory memory of the one or more repeating portions of the values in at least one header record of a compressed data structure;

initiating a storage in the non-transitory memory of non-repeating portions of the values in respective point records of the compressed data structure that directly follows the at least one header record or within a body of the compressed data structure;

organizing the at least one header record, the respective one or more point records, or a combination thereof, into one or more sub-header records or one or more sub-point records, respectively, each stored with at least one common value across the header record or the point records, respectively, as one or more hierarchies based, at least in part, on the one or more field types; and initiating a transmission of a packet comprising a header that contains the one or more repeating portions obtained from the at least one header record and a payload that contains the non-repeating portions obtained from the point records via a network to another apparatus, wherein the apparatus and the non-transitory memory are embedded in a mobile terminal, and the compressed data structure represents, at least in part, a compressed version of the plurality of data records.

\* \* \* \* \*